(12) United States Patent
Yamazaki et al.

(10) Patent No.: US 11,255,730 B2
(45) Date of Patent: Feb. 22, 2022

(54) LIGHT DETECTOR

(71) Applicant: HAMAMATSU PHOTONICS K.K., Hamamatsu (JP)

(72) Inventors: Masahiro Yamazaki, Hamamatsu (JP); Katsumi Shibayama, Hamamatsu (JP); Ryusuke Kitaura, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/468,070

(22) PCT Filed: Nov. 30, 2017

(86) PCT No.: PCT/JP2017/043171
§ 371 (c)(1),
(2) Date: Jun. 10, 2019

(87) PCT Pub. No.: WO2018/110309
PCT Pub. Date: Jun. 21, 2018

(65) Prior Publication Data
US 2020/0072677 A1 Mar. 5, 2020

(30) Foreign Application Priority Data
Dec. 14, 2016 (JP) .............................. JP2016-242465

(51) Int. Cl.
*G01J 5/24* (2006.01)
*G01J 5/02* (2022.01)
(Continued)

(52) U.S. Cl.
CPC ................. *G01J 5/24* (2013.01); *G01J 5/024* (2013.01); *H01L 31/02327* (2013.01); *H01L 31/09* (2013.01)

(58) Field of Classification Search
CPC .... G01J 5/24; G01J 5/024; G01J 5/023; G01J 5/20; H01L 31/02327; H01L 31/09; H01L 27/144; H01L 31/0248
See application file for complete search history.

(56) References Cited

U.S. PATENT DOCUMENTS 4,803,375 A * 2/1989 Saito ................... H01L 27/1446
250/208.1
6,229,144 B1 5/2001 Ouvrier-Buffet et al.
(Continued)

FOREIGN PATENT DOCUMENTS

CN 104359551 A 2/2015
JP S62-229874 A 10/1987
(Continued)

OTHER PUBLICATIONS

International Preliminary Report on Patentability dated Jun. 27, 2019 for PCT/JP2017/043171.

*Primary Examiner* — Marcus H Taningco
(74) *Attorney, Agent, or Firm* — Faegre Drinker Biddle & Reath LLP

(57) ABSTRACT

A light detector includes: a substrate; and a membrane which is supported on a surface of the substrate so that a space is formed between the surface of the substrate and the membrane, in which the membrane includes a first wiring layer and a second wiring layer which are opposite each other with a gap extending along a line having a curved portion interposed therebetween and a resistance layer which is electrically connected to each of the first wiring layer and the second wiring layer and has an electric resistance depending on a temperature, and in which a first edge portion at the side of the line in the first wiring layer and a second edge portion at the side of the line in the second wiring layer respectively continuously extend.

12 Claims, 15 Drawing Sheets

(51) Int. Cl.
  *H01L 31/0232*   (2014.01)
  *H01L 31/09*   (2006.01)

(56) References Cited

U.S. PATENT DOCUMENTS

| | | | |
|---|---|---|---|
| 7,718,965 B1* | 5/2010 | Syllaios | G01J 5/046 250/338.1 |
| 2003/0098445 A1 | 5/2003 | Higuma et al. | |
| 2004/0140428 A1 | 7/2004 | Ionescu et al. | |
| 2009/0152467 A1* | 6/2009 | Cheon | G01J 5/023 250/338.4 |
| 2011/0182322 A1* | 7/2011 | Kamikawa | G01J 5/023 374/121 |
| 2012/0132804 A1 | 5/2012 | Lee et al. | |
| 2012/0175723 A1* | 7/2012 | Fujiwara | G01J 5/024 257/467 |
| 2014/0319359 A1* | 10/2014 | Sasaki | G01J 5/20 250/353 |
| 2017/0082497 A1* | 3/2017 | Cannata | G01J 5/024 |

FOREIGN PATENT DOCUMENTS

| | | |
|---|---|---|
| JP | H05-172629 A | 7/1993 |
| JP | H9-243450 A | 9/1997 |
| JP | 2000-356544 A | 12/2000 |
| JP | 2002-250655 A | 9/2002 |
| JP | 2003-106896 A | 4/2003 |
| JP | 2003-294523 A | 10/2003 |
| JP | 2007-509315 A | 4/2007 |
| JP | 2014-190894 A | 10/2014 |
| JP | 2015-531872 A | 11/2015 |
| WO | WO-2005/034248 A1 | 4/2005 |
| WO | WO-2014/036250 A2 | 3/2014 |

* cited by examiner

*Fig.7*
(a)
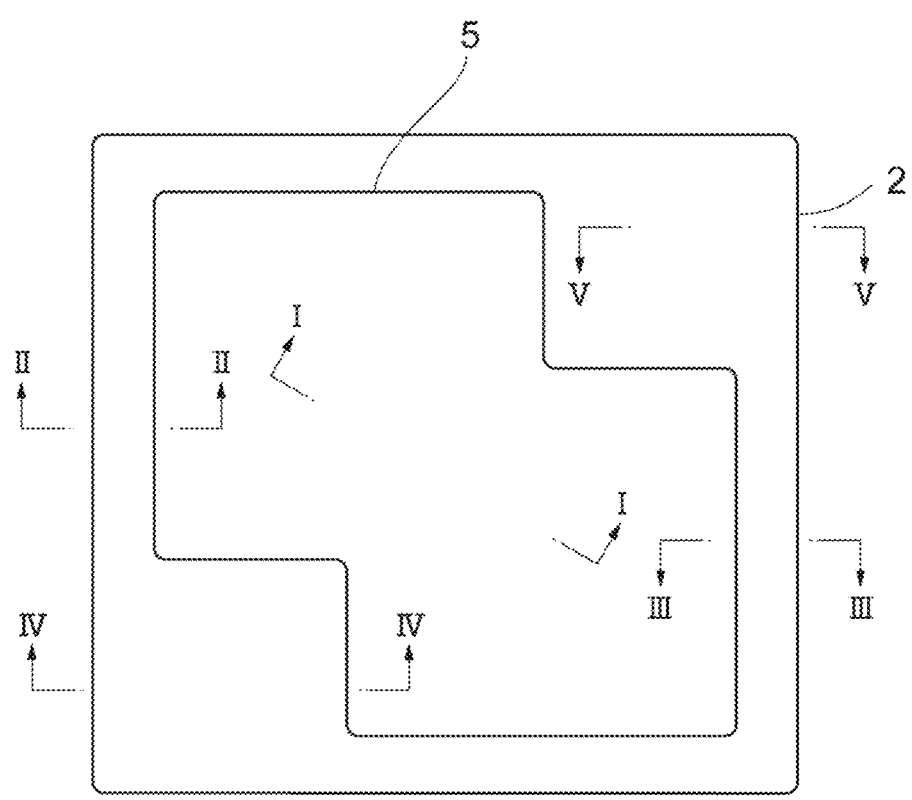
(b)
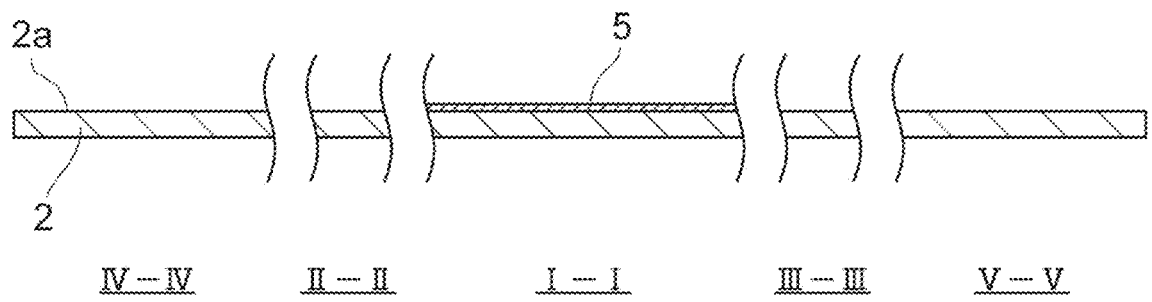

Fig.8
(a)
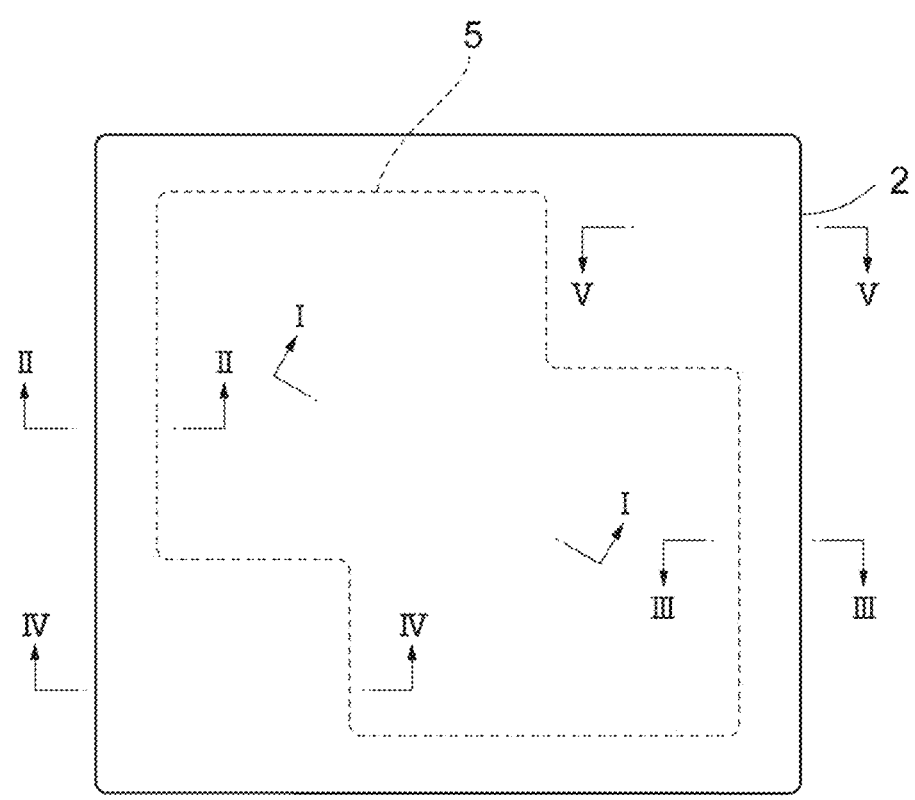
(b)
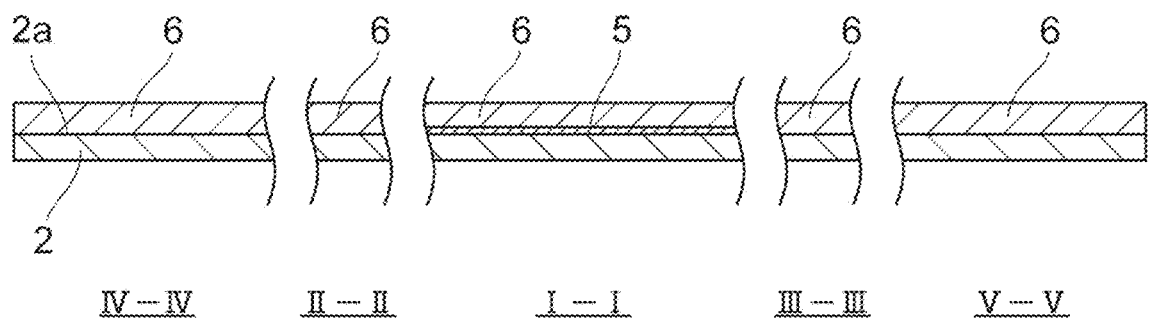

*Fig.9*
(a)
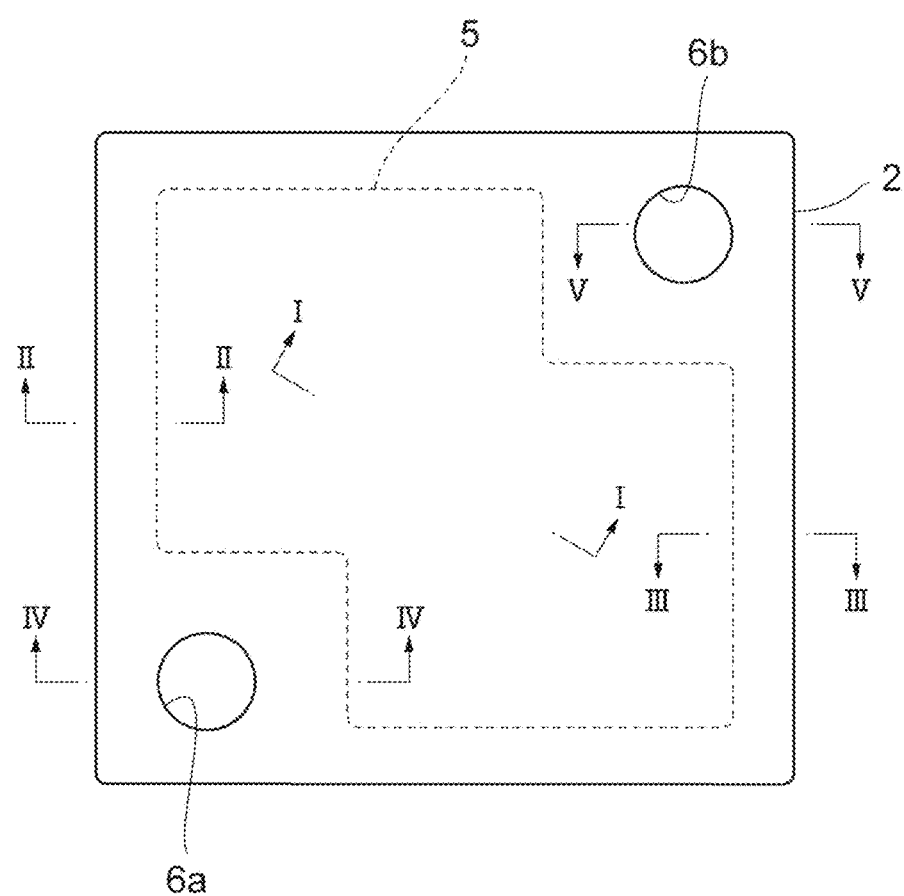
(b)
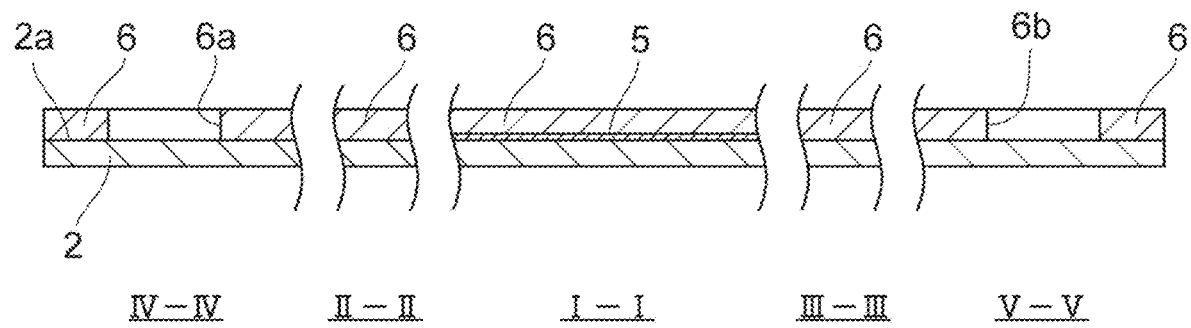

Fig.10
(a)
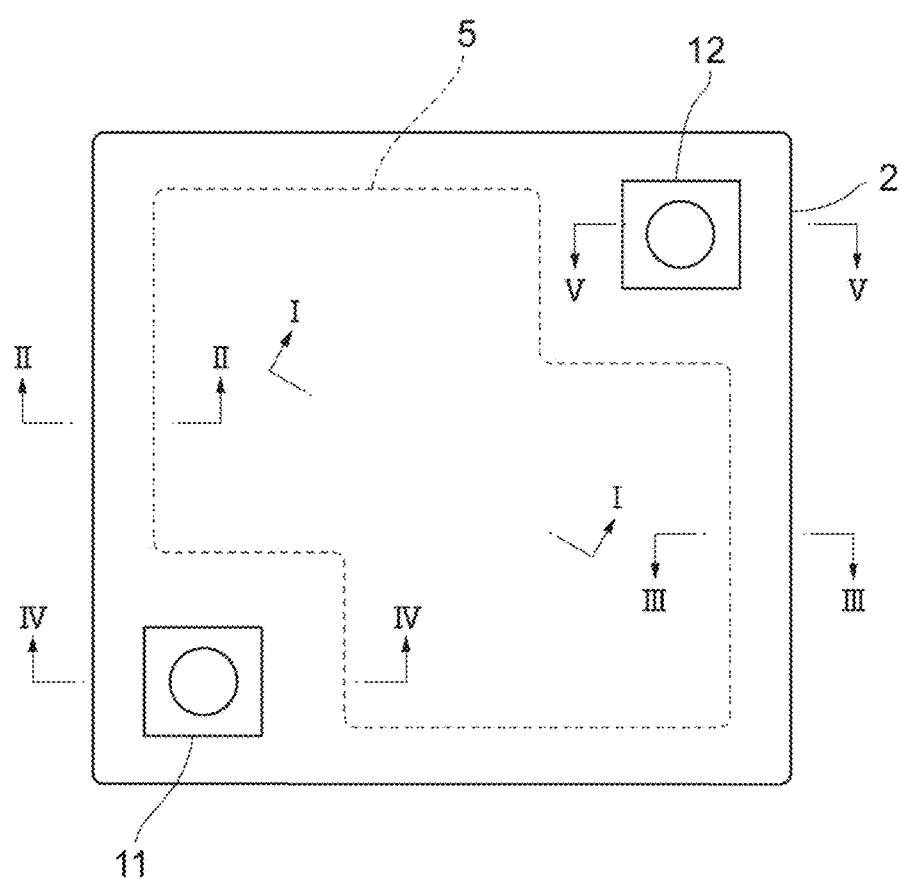
(b)
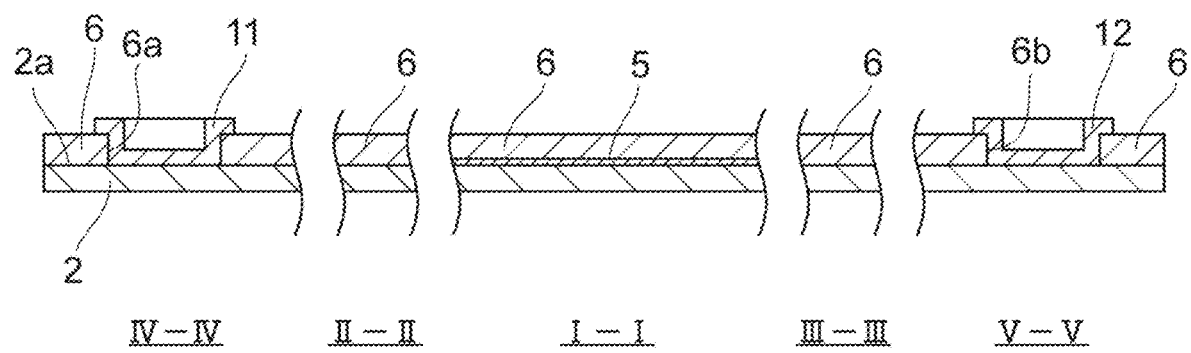

Fig.11
(a)
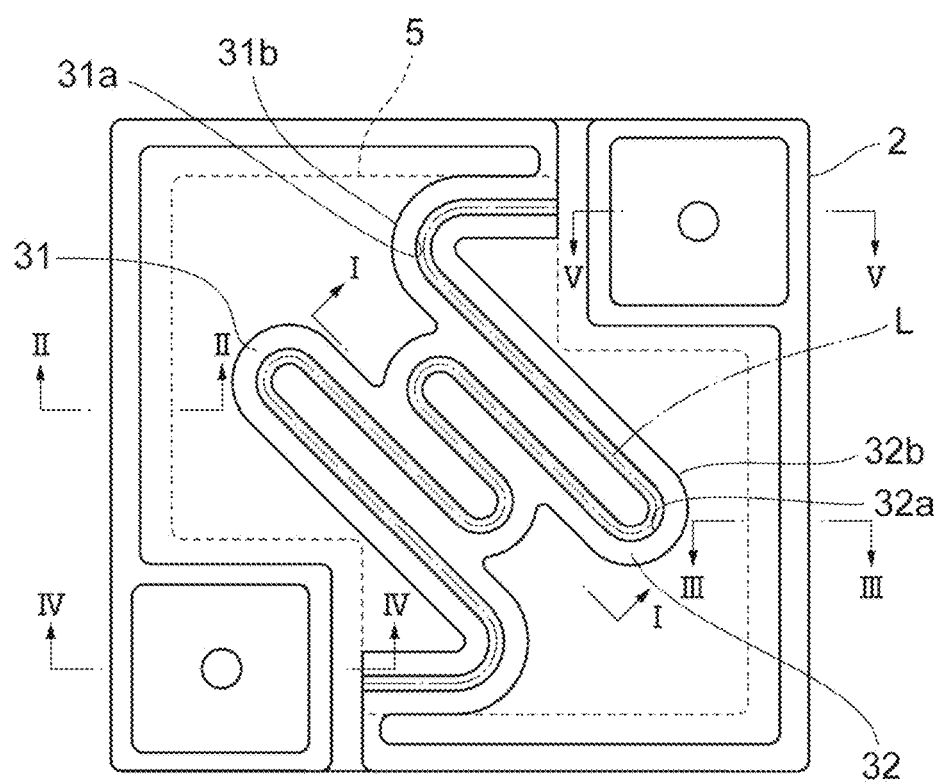
(b)
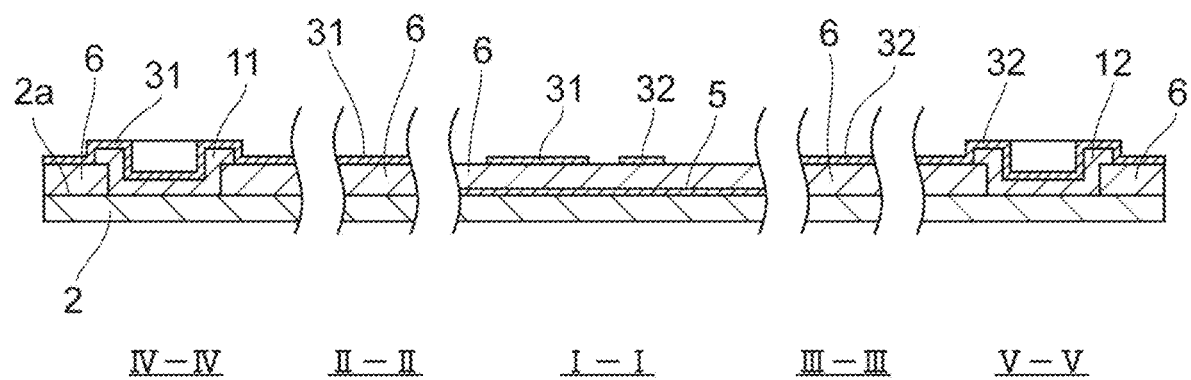
IV-IV  II-II  I-I  III-III  V-V

*Fig.12*
(a)
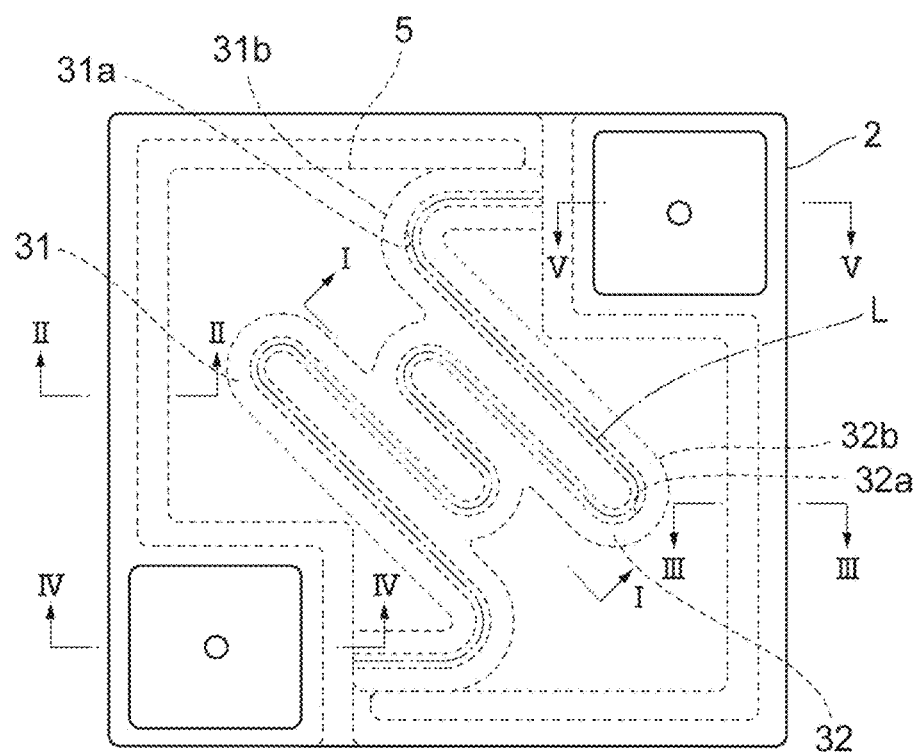
(b)
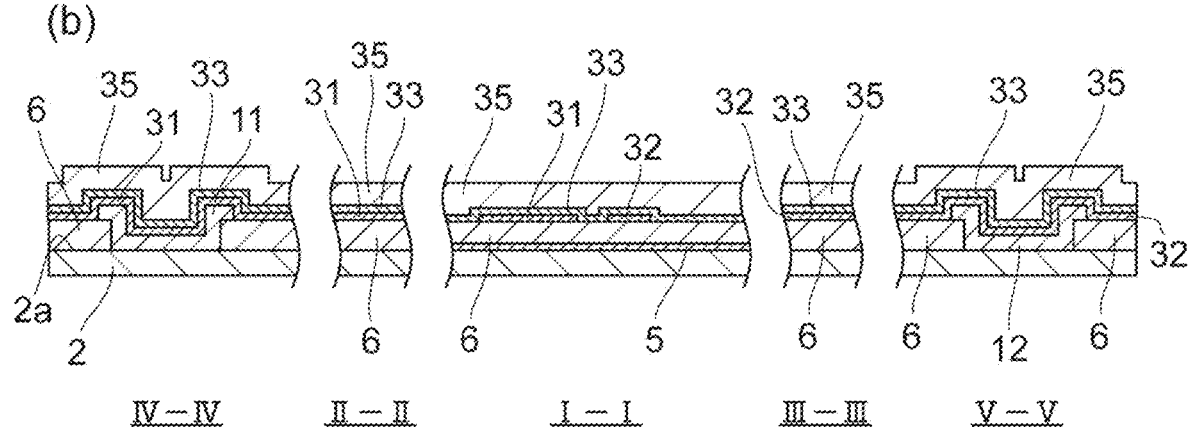

Fig.14
(a)
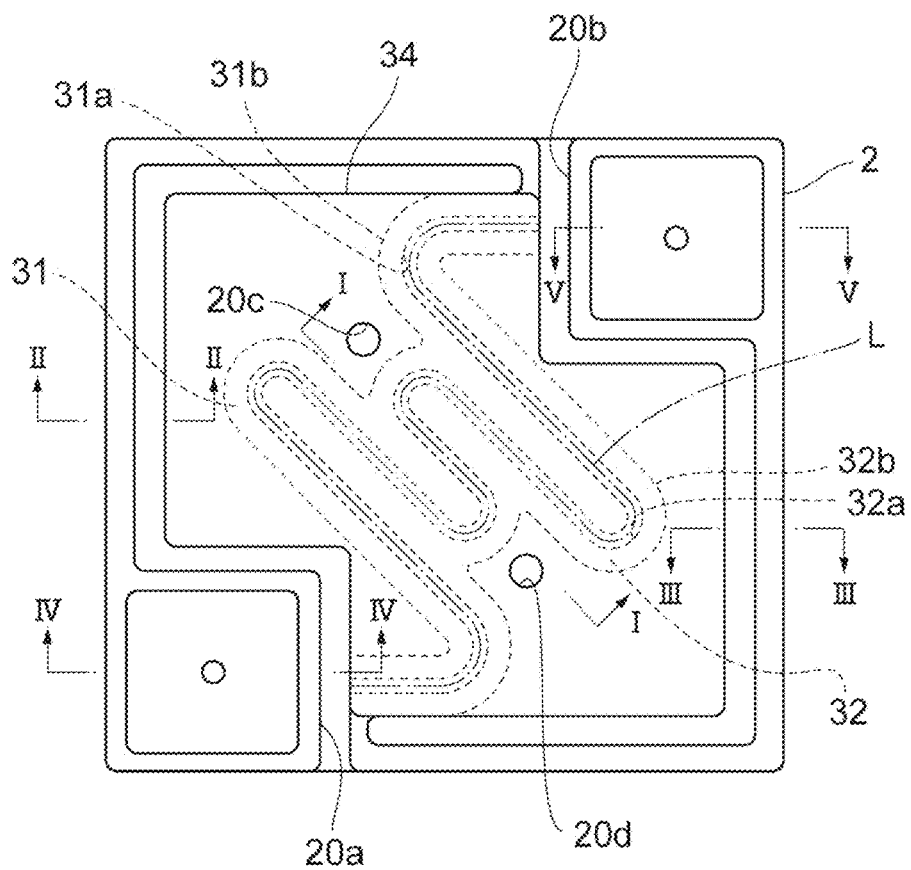
(b)
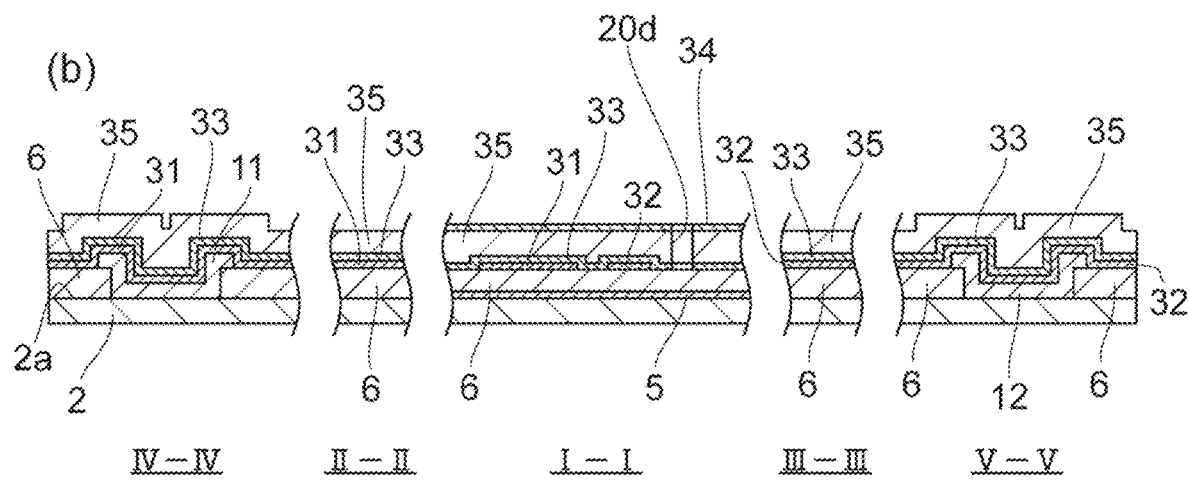

Fig.15
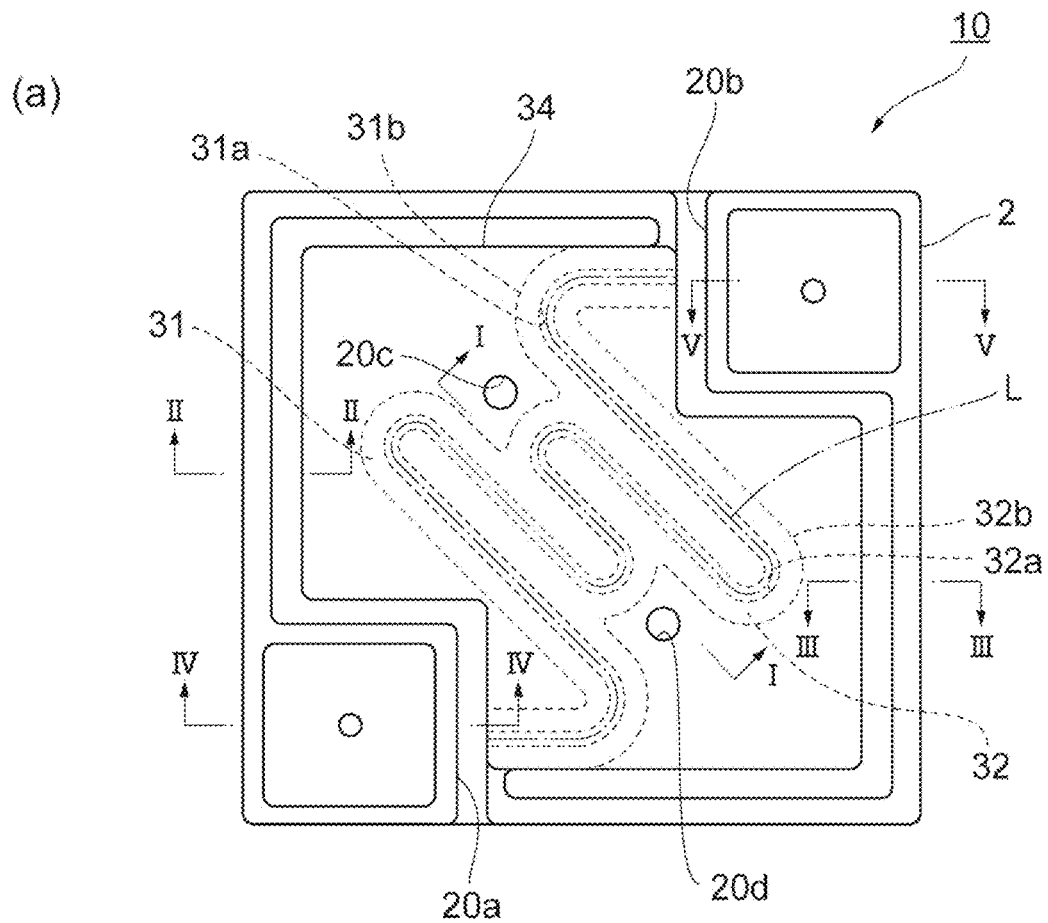
(a)
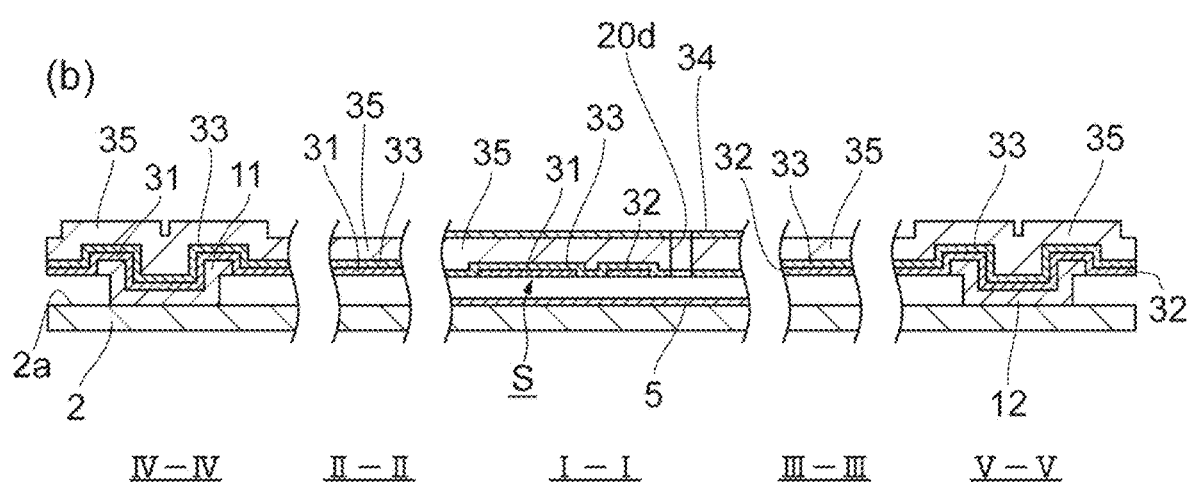
(b)
IV-IV    II-II    I-I    III-III    V-V

LIGHT DETECTOR

TECHNICAL FIELD

An aspect of the invention relates to a light detector.

BACKGROUND ART

As a light detector, one including a substrate and a membrane supported on a surface of the substrate so that a space is formed between the surface of the substrate and the membrane is known and the membrane includes a pair of wiring layers opposite each other with a gap interposed therebetween and a resistance layer having an electric resistance depending on a temperature (for example, see Patent Literature 1). In an infrared sensor described in Patent Literature 1, a gap between a pair of electrodes corresponding to a pair of wiring layers extends in a rectangular wave shape.

CITATION LIST

Patent Literature

Patent Literature 1: Japanese Unexamined Patent Publication No. 2003-106896

SUMMARY OF INVENTION

Technical Problem

In the infrared sensor described in Patent Literature 1, since a gap between the pair of electrodes extends in a rectangular wave shape, sensitivity can be improved as compared with a case in which the gap extends in a linear shape. However, in the infrared sensor described in Patent Literature 1, when the membrane is thinned in order to improve a response speed, stress easily concentrates on a corner portion of the gap extending in a rectangular wave shape due to the deformation of the membrane and hence deterioration in characteristic as a sensor may occur.

Here, an object of an aspect of the invention is to provide a light detector capable of improving sensitivity and response speed.

Solution to Problem

A light detector according to an aspect of the invention includes: a substrate; and a membrane which is supported on a surface of the substrate so that a space is formed between the surface of the substrate and the membrane, in which the membrane includes a first wiring layer and a second wiring layer which are opposite each other with a gap extending along a line having a curved portion interposed therebetween and a resistance layer which is electrically connected to each of the first wiring layer and the second wiring layer and has an electric resistance depending on a temperature, and in which a first edge portion at the side of the line in the first wiring layer and a second edge portion at the side of the line in the second wiring layer respectively continuously extend.

In the light detector, the gap between the first wiring layer and the second wiring layer extends along the line having the curved portion. Accordingly, sensitivity is improved as compared with a case in which the gap extends in a linear shape. Further, the first edge portion at the side of the line in the first wiring layer and the second edge portion at the side of the line in the second wiring layer respectively continuously extend. Accordingly, even when the membrane is thinned in order to improve the response speed, the occurrence of stress concentration due to the deformation of the membrane in the first edge portion and the second edge portion is suppressed. As described above, according to the light detector, sensitivity and response speed can be improved.

In the light detector according to an aspect of the invention, the line may include a meandering portion having the curved portion. According to this configuration, since the gap is further lengthened, sensitivity can be further improved.

In the light detector according to an aspect of the invention, the meandering portion may include a first section which swings to one side by a first swinging amount larger than a predetermined amount and a second section which swings to one side by a second swinging amount smaller than the predetermined amount and the membrane may be provided with a through-hole which is located at one side of the second section. According to this configuration, the position of the through-hole can be located near the center portion of the membrane while preventing the through-hole from penetrating the membrane at the gap. Thus, it is possible to highly efficiently form the membrane by performing an etching through the through-hole in the light detector manufacturing process.

In the light detector according to an aspect of the invention, the second section may be sandwiched between the two first sections and the through-hole may be located between the two first sections. According to this configuration, the position of the through-hole can be located near the center portion of the membrane while preventing the through-hole from penetrating the membrane at the gap. Thus, it is possible to highly efficiently form the membrane by performing an etching through the through-hole in the light detector manufacturing process.

In the light detector according to an aspect of the invention, the membrane may further include a light absorption layer which is opposite to the surface of the substrate and a separation layer which is disposed between the first wiring layer and the light absorption layer, and the second wiring layer and the absorption layer, and the light absorption layer may include a first region which spreads to the side opposite to the second wiring layer with respect to the first wiring layer when viewed from the thickness direction of the substrate and a second region which spreads to the side opposite to the first wiring layer with respect to the second wiring layer when viewed from the thickness direction of the substrate. In this configuration, the first region of the light absorption layer spreads to the side opposite to the second wiring layer with respect to the first wiring layer and the second region of the light absorption layer spreads to the side opposite to the first wiring layer with respect to the second wiring layer when viewed from the thickness direction of the substrate. That is, the first region of the light absorption layer does not overlap the first wiring layer and the second region of the light absorption layer does not overlap the second wiring layer when viewed from the thickness direction of the substrate. Accordingly, sufficient light absorption in the first region and the second region of the light absorption layer is realized. Further, the separation layer is disposed between the first wiring layer and the light absorption layer, and the second wiring layer and the absorption layer. Accordingly, since heat generated in the light absorption layer is suppressed from escaping to the substrate through the first wiring layer and the second wiring layer, the heat is sufficiently transmitted to the resistance layer through the separation layer. As described above, according to this configuration, sensitivity can be further improved.

In the light detector according to an aspect of the invention, a third edge portion at the side opposite to the line in the first wiring layer and a fourth edge portion at the side opposite to the line in the second wiring layer may continuously extend. According to this configuration, even when the membrane is thinned in order to improve the response speed, it is possible to suppress the occurrence of stress concentration due to the deformation of the membrane in the third edge portion and the fourth edge portion in addition to the first edge portion and the second edge portion.

The light detector according to an aspect of the invention may further include a light reflection layer which is disposed on the surface of the substrate and constitutes an optical resonance structure along with the light absorption layer. According to this configuration, it is possible to realize light absorption in a wavelength region corresponding to a distance between the light absorption layer and the light reflection layer.

In the light detector according to an aspect of the invention, a total area of the first wiring layer and the second wiring layer may be smaller than a total area of the first region and the second region when viewed from the thickness direction of the substrate. According to this configuration, since more sufficient light absorption in the first region and the second region of the light absorption layer is realized and the heat generated in the light absorption layer is further suppressed from escaping to the substrate through the first wiring layer and the second wiring layer, sensitivity can be further improved.

In the light detector according to an aspect of the invention, a total area of the first wiring layer and the second wiring layer may be smaller than a area of each of the first region and the second region when viewed from the thickness direction of the substrate. According to this configuration, since more sufficient light absorption in the first region and the second region of the light absorption layer is realized and the heat generated in the light absorption layer is further suppressed from escaping to the substrate through the first wiring layer and the second wiring layer, sensitivity can be further improved.

In the light detector according to an aspect of the invention, a length of each of the first wiring layer and the second wiring layer in a direction along the line may be larger than a width of each of the first wiring layer and the second wiring layer in a direction perpendicular to the line when viewed from the thickness direction of the substrate. According to this configuration, since the gap is further lengthened, sensitivity can be further improved.

Advantageous Effects of Invention

According to an aspect of the invention, it is possible to provide a light detector capable of improving sensitivity and response speed.

BRIEF DESCRIPTION OF DRAWINGS

FIG. 7 is a diagram illustrating a light detector manufacturing method of FIG. 5.
FIG. 8 is a diagram illustrating the light detector manufacturing method of FIG. 5.
FIG. 9 is a diagram illustrating the light detector manufacturing method of FIG. 5.
FIG. 10 is a diagram illustrating the light detector manufacturing method of FIG. 5.
FIG. 11 is a diagram illustrating the light detector manufacturing method of FIG. 5.
FIG. 12 is a diagram illustrating the light detector manufacturing method of FIG. 5.
FIG. 14 is a diagram illustrating the light detector manufacturing method of FIG. 5.
FIG. 15 is a diagram illustrating the light detector manufacturing method of FIG. 5.

DESCRIPTION OF EMBODIMENTS

Figure 1:
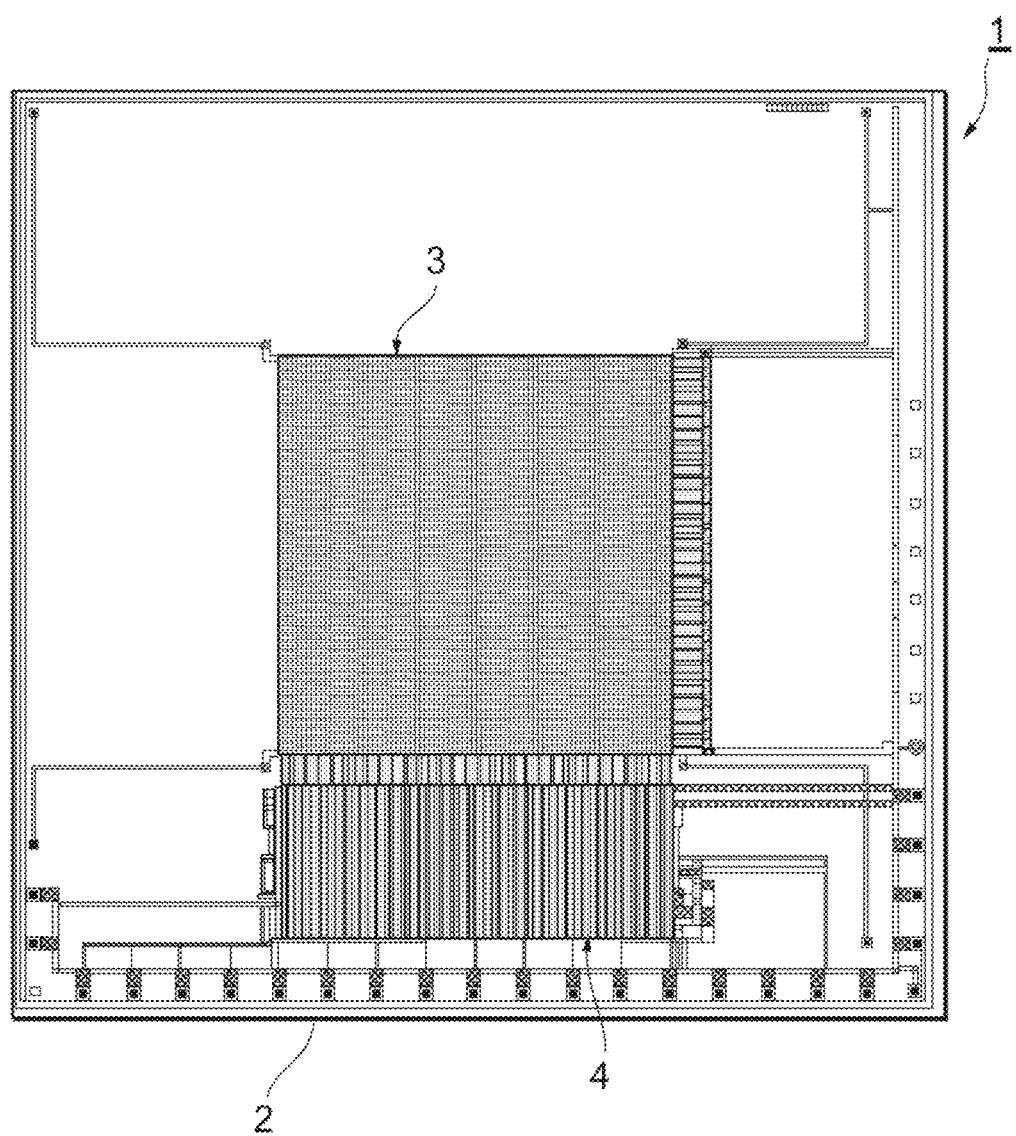
FIG. 1 is a plan view of a light detector of an embodiment.

Hereinafter, a preferred embodiment of the invention will be described in detail with reference to the drawings. Additionally, the same reference numerals will be given to the same or equivalent parts in the drawings and a repetitive description thereof will be omitted.

A light detector 1 illustrated in FIG. 1 detects light by using a function of a bolometer. The light is, for example, infrared light. When the light is infrared light, the light detector 1 is used in an infrared imager, thermography, and the like. As illustrated in FIG. 1, the light detector 1 includes a substrate 2, a pixel unit 3, and a signal processing circuit unit 4. The substrate 2 is, for example, a Si substrate. The thickness of the substrate 2 is, for example, about several hundred μm. The pixel unit 3 and the signal processing circuit unit 4 are formed on the substrate 2 and are electrically connected to each other. Additionally, the signal processing circuit unit 4 may be formed inside the substrate 2.

Figure 2:
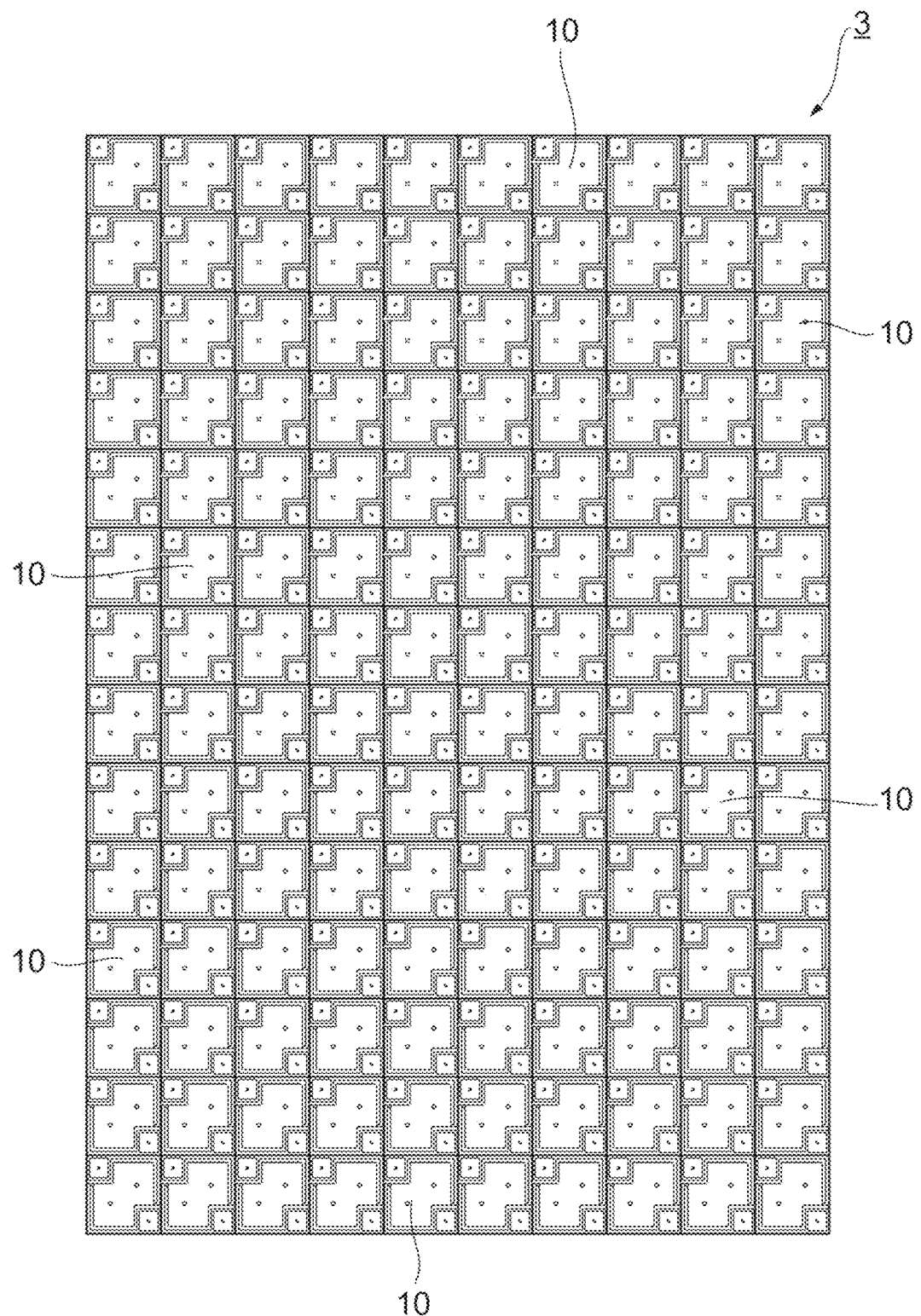
FIG. 2 is a plan view of a pixel unit of the light detector of FIG. 1.
Figure 3:
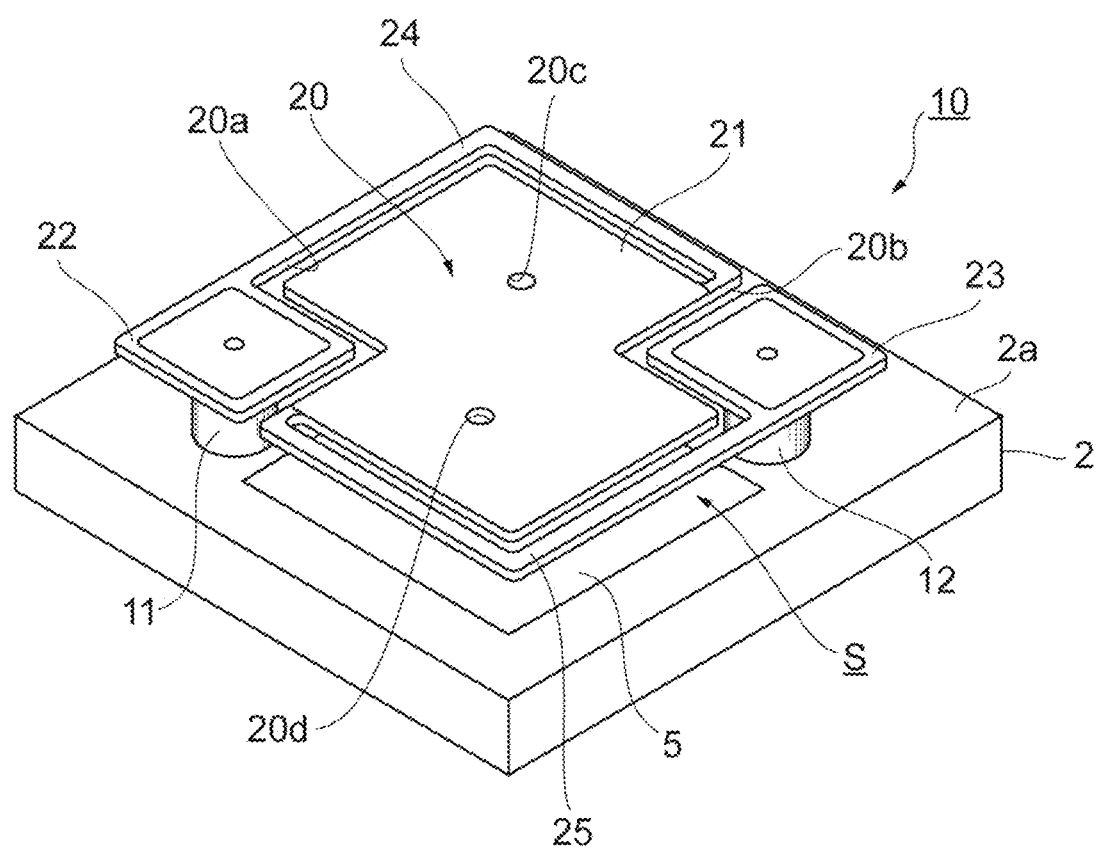
FIG. 3 is a perspective view of a light detecting element of the pixel unit of FIG. 2.

As illustrated in FIG. 2, the pixel unit 3 includes a plurality of light detecting elements 10. The plurality of light detecting elements 10 are arranged in a two-dimensional matrix shape. As illustrated in FIG. 3, the light detecting element 10 includes the substrate 2 (exactly a part of the substrate 2), a light reflection layer 5, a pair of electrode plugs 11 and 12, and a membrane 20.

The light reflection layer 5 is formed on a surface 2a of the substrate 2. The light reflection layer 5 is opposite to a light absorption layer 34 to be described later and constitutes an optical resonance structure along with the light absorption layer 34. The thickness of the light reflection layer 5 is, for example, about several hundreds of nm. The material of the light reflection layer 5 is, for example, a metal material (for example, Al or the like) having large reflectivity with respect to light (for example, infrared light).

The pair of electrode plugs 11 and 12 is formed on the surface 2a of the substrate 2. Each of the electrode plugs 11 and 12 is formed in, for example, a columnar shape. The height of each of the electrode plugs 11 and 12 is, for example, about several μm. The material of each of the electrode plugs 11 and 12 is, for example, a metal material such as Ti. The pair of electrode plugs 11 and 12 supports the membrane 20 on the surface 2a of the substrate 2 so that a space S is formed between the surface 2a of the substrate 2 and the membrane 20. The membrane 20 is disposed in substantially parallel to the surface 2a of the substrate 2. A distance between the membrane 20 and the surface 2a of the substrate 2 is, for example, about several μm.

Figure 4:
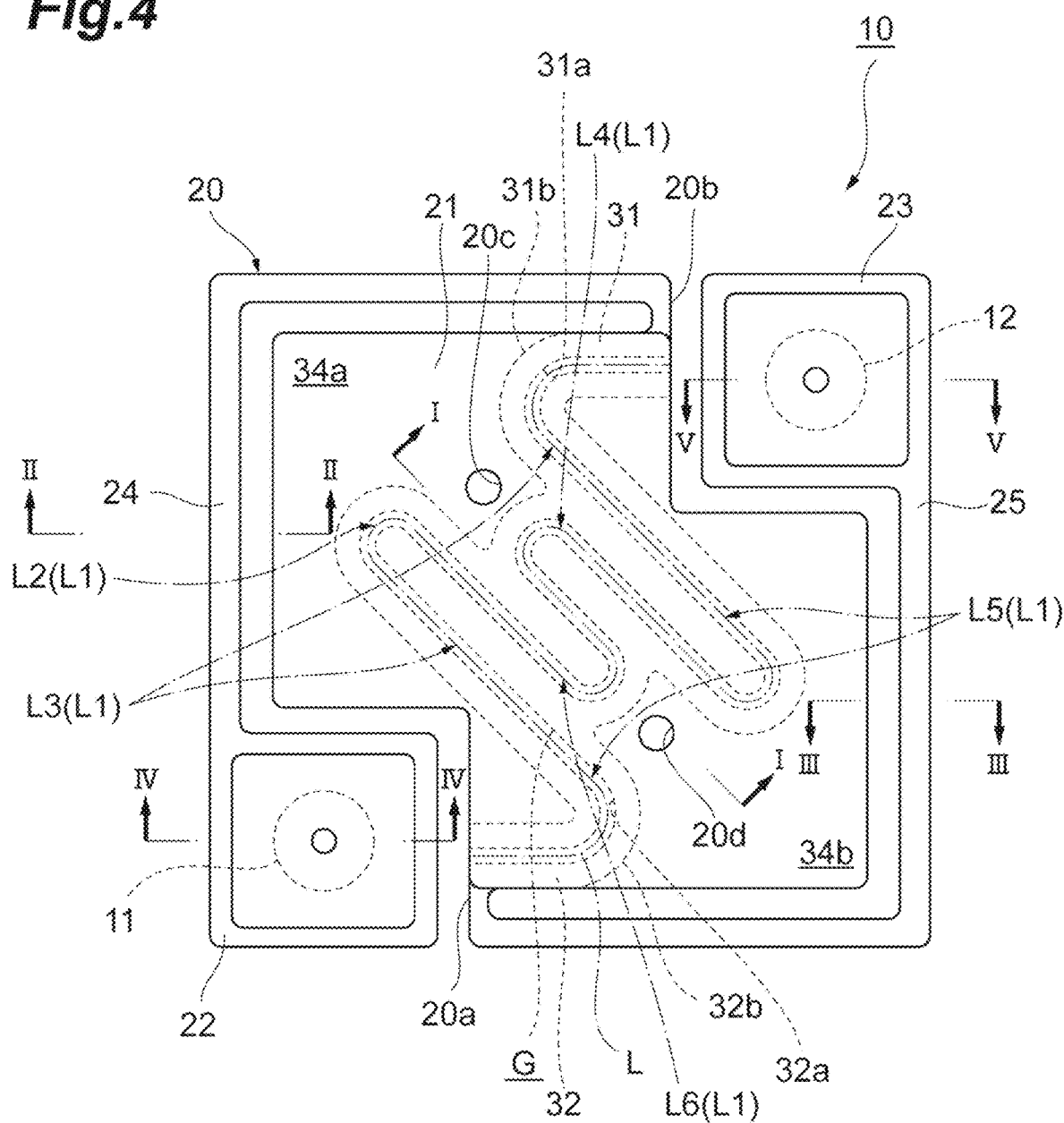
FIG. 4 is a plan view of the light detecting element of FIG. 3.

As illustrated in FIGS. 3 and 4, the membrane 20 includes a light receiving portion 21, a pair of electrode portions 22 and 23, and a pair of beam portions 24 and 25. The light receiving portion 21 spreads to avoid each of the electrode plugs 11 and 12 when viewed from the thickness direction of the substrate 2 (that is, a direction perpendicular to the surface 2a of the substrate 2). The electrode portion 22 is disposed on the electrode plug 11. The electrode portion 23 is disposed on the electrode plug 12. The beam portion 24 extends along the outer edge of the light receiving portion 21 at one side of the light receiving portion 21. The beam portion 25 extends along the outer edge of the light receiving portion 21 at the other side of the light receiving portion 21. One end of the beam portion 24 is connected to the electrode portion 22 and the other end of the beam portion 24 is connected to the light receiving portion 21 at a position in the vicinity of the electrode portion 23. One end of the beam portion 25 is connected to the electrode portion 23 and the other end of the beam portion 25 is connected to the light receiving portion 21 at a position in the vicinity of the electrode portion 22. The membrane 20 has, for example, a rectangular shape when viewed from the thickness direction of the substrate 2. The pair of electrode portions 22 and 23 is respectively provided at diagonal positions of the membrane 20.

The light receiving portion 21, the pair of electrode portions 22 and 23, and the pair of beam portions 24 and 25 are integrally formed with one another. Slits 20a are formed in series between the light receiving portion 21 and the electrode portion 22 and between the light receiving portion 21 and the beam portion 24. Slits 20b are formed in series between the light receiving portion 21 and the electrode portion 23 and between the light receiving portion 21 and the beam portion 25. The width of each of the beam portions 24 and 25 is, for example, about several μm and the length of each of the beam portions 24 and 25 is, for example, about several tens of μm. The width of each of the slits 20a and 20b is, for example, about several μm.

Figure 5:
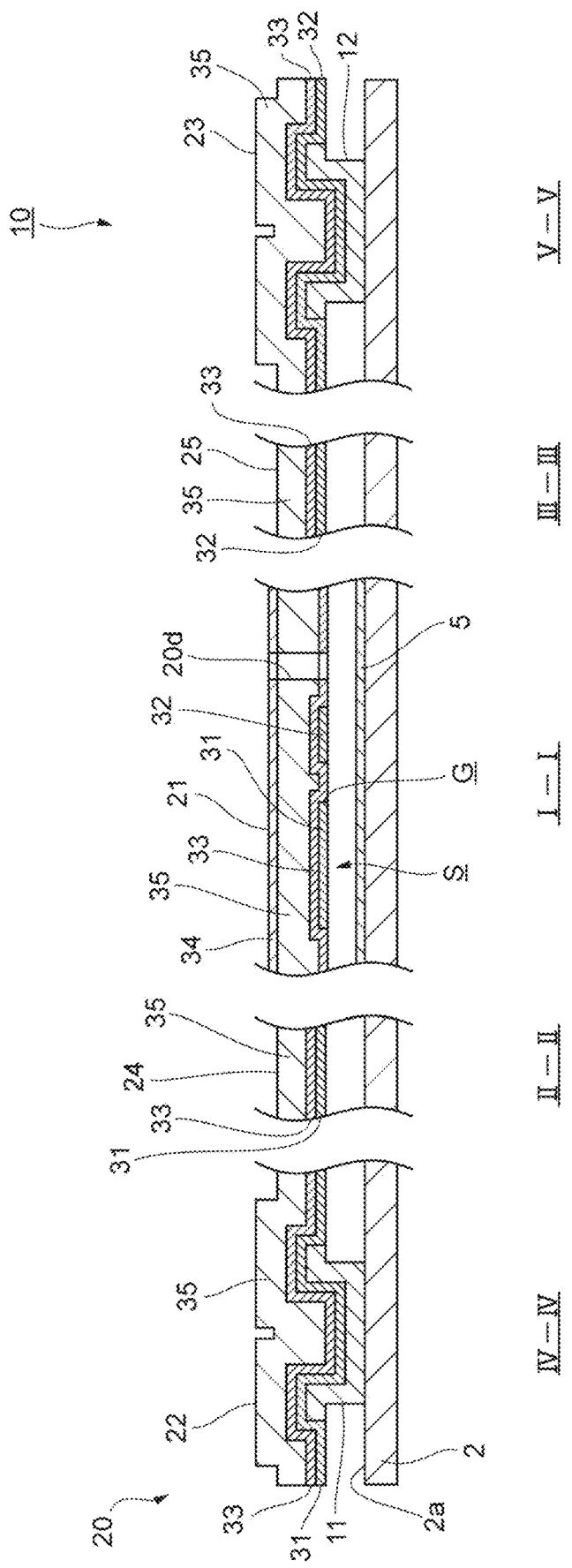
FIG. 5 is a cross-sectional view of the light detecting element of FIG. 3.

FIG. 5 is a cross-sectional view of the light detecting element 10. The I-I, II-II, III-III, IV-IV, and V-V of FIG. 5 are cross-sectional views taken along the lines I-I, II-II, III-III, IV-IV, and V-V of FIG. 4. As illustrated in FIG. 5, the membrane 20 includes a first wiring layer 31, a second wiring layer 32, a resistance layer 33, a light absorption layer 34, and a separation layer 35.

As illustrated in FIGS. 4 and 5, the first wiring layer 31 and the second wiring layer 32 are opposite each other in the light receiving portion 21 with a gap G interposed therebetween when viewed from the thickness direction of the substrate 2. The gap G extends along the line L. The line L extends in, for example, a meandering shape to connect the electrode portion 22 and the electrode portion 23 when viewed from the thickness direction of the substrate 2. Specifically, the line L includes a meandering portion L1. The meandering portion L1 includes a plurality of curved portions L2. The meandering portion L1 extends to one side of the light receiving portion 21, is folded back by, for example, 180° at the curved portion L2, extends to the other side of the light receiving portion 21, is folded back by, for example, 180° at the curved portion L2, and again extends to one side of the light receiving portion 21.

In the embodiment, one side means one side with respect to a line connecting the electrode portion 22 and the electrode portion 23 (for example, the existence side of the beam portion 24) when viewed from the thickness direction of the substrate 2 and the other side means the side (for example, the existence side of the beam portion 25) opposite to one side with respect to the line connecting the electrode portion 22 and the electrode portion 23 when viewed from the thickness direction of the substrate 2. Further, one side may means one side (for example, the existence side of the beam portion 24) with respect to a line passing through a center of the membrane 20 when viewed from the thickness direction of the substrate 2 and the other side means the side (the existence side of the beam portion 25) opposite to one side with respect to the line passing through the center of the membrane 20 when viewed from the thickness direction of the substrate 2. That is, one side means the side of a first region 34a of the light absorption layer 34 and the other side means the side of a second region 34b of the light absorption layer 34.

When viewed from the thickness direction of the substrate 2, the meandering portion L1 includes a first section L3, a second section L4, a third section L5, and a fourth section L6. The first section L3 swings to one side by a first swinging amount. The second section L4 swings to one side by a second swinging amount. When viewed from the thickness direction of the substrate 2, the second section L4 is sandwiched between two first sections L3 in a direction of a line connecting the electrode portion 22 and the electrode portion 23. The third section L5 swings to the other side by a first swinging amount. The fourth section L6 swings to the other side by a second swinging amount. When viewed from the thickness direction of the substrate 2, the fourth section L6 is sandwiched between two third sections L5 in a direction of the line connecting the electrode portion 22 and the electrode portion 23. The first swinging amount is larger than a predetermined amount. The second swinging amount is smaller than a predetermined amount. The first swinging amount is, for example, about several tens of μm. The second swinging amount is, for example, about several μm.

Specifically, in the light receiving portion 21, the first section L3 extends to one side of the light receiving portion 21 by the first swinging amount, is folded back at the curved portion L2 by, for example, 180°, and extends to the other side of the light receiving portion 21 by the first swinging amount. Then, the fourth section L6 extends to the other side of the light receiving portion 21 by the second swinging amount, is folded back at the curved portion L2 by, for example, 180°, and extends to one side of the light receiving portion 21 by the second swinging amount. Then, the second section L4 extends to one side of the light receiving portion 21 by the second swinging amount, is folded back at the curved portion L2 by, for example, 180°, and extends to the other side of the light receiving portion 21 by the second swinging amount. Then, the third section L5 extends to the other side of the light receiving portion 21 by the first swinging amount, is folded back at the curved portion L2 by, for example, 180°, and extends to one side of the light receiving portion 21 by the first swinging amount. The meandering portion L1 is formed by repeating such operations. Additionally, each of the first section L3, the second section L4, the third section L5, and the fourth section L6 includes the curved portion L2, respectively.

The first wiring layer 31 and the second wiring layer 32 are formed in an elongated shape in a direction along the line L in the light receiving portion 21. That is, when viewed from the thickness direction of the substrate 2, the length of each of the first wiring layer 31 and the second wiring layer 32 in a direction along the line L in the light receiving portion 21 is larger than the width of each of the first wiring layer 31 and the second wiring layer 32 in a direction perpendicular to the line L. The direction perpendicular to the line L means a direction perpendicular to a tangent line at each position of the line L when viewed from the thickness direction of the substrate 2. Directions perpendicular to the line L are different at each position of the curved portion, respectively.

Specifically, the first wiring layer 31 includes a first edge portion 31a and a third edge portion 31b in the light receiving portion 21. When viewed from the thickness direction of the substrate 2, each of the first edge portion 31a and the third edge portion 31b extends along the line L. The first edge portion 31a extends to the side of the line L. The third edge portion 31b extends to the side opposite to the line L. The second wiring layer 32 includes a second edge portion 32a and a fourth edge portion 32b in the light receiving portion 21. When viewed from the thickness direction of the substrate 2, each of the second edge portion 32a and the fourth edge portion 32b extends along the line L. The second edge portion 32a extends to the side of the line L. The fourth edge portion 32b extends to the side opposite to the line L.

When viewed from the thickness direction of the substrate 2, the first edge portion 31a and the second edge portion 32a are opposite each other with the line L interposed therebetween. That is, when viewed from the thickness direction of the substrate 2, the gap G is defined by the first edge portion 31a and the second edge portion 32a.

When viewed from the thickness direction of the substrate 2, the first edge portion 31a at the side of the line L and the third edge portion 31b at the side opposite to the line L in the first wiring layer 31 and the second edge portion 32a at the side of the line L and the fourth edge portion 32b at the side opposite to the line L in the second wiring layer 32 respectively extend continuously. A state in which the edge portion extends continuously means a state in which the edge portion is formed smoothly without a corner portion. That is, the edge portion which extends continuously does not include a portion with an infinite small curvature radius. For example, the minimum value of the curvature radius of each of the first edge portion 31a, the second edge portion 32a, the third edge portion 31b, and the fourth edge portion 32b is larger than 0.01 μm.

When viewed from the thickness direction of the substrate 2, the length of each of the first wiring layer 31 and the second wiring layer 32 in a direction along the line L of the light receiving portion 21 is, for example, several tens to several hundreds of μm. When viewed from the thickness direction of the substrate 2, the width of each of the first wiring layer 31 and the second wiring layer 32 in a direction perpendicular to the line L is, for example, about several μm. When viewed from the thickness direction of the substrate 2, the width of the gap G in a direction perpendicular to the line L is, for example, about several μm. The thickness of each of the first wiring layer 31 and the second wiring layer 32 is, for example, about several tens to several hundreds of nm.

The first wiring layer 31 extends from the light receiving portion 21 to the electrode portion 22 through the beam portion 24. The first wiring layer 31 is formed on the electrode plug 11 in the electrode portion 22. The first wiring layer 31 is electrically connected to the electrode plug 11. The second wiring layer 32 extends from the light receiving portion 21 to the electrode portion 23 through the beam portion 25. The second wiring layer 32 is formed on the electrode plug 12 in the electrode portion 23. The second wiring layer 32 is electrically connected to the electrode plug 12. The material of each of the first wiring layer 31 and the second wiring layer 32 is, for example, a metal material such as Ti.

The resistance layer 33 is formed to cover the first wiring layer 31 and the second wiring layer 32 from the side opposite to the substrate 2 in the light receiving portion 21. The resistance layer 33 covers the surface opposite to the substrate 2 of each of the first wiring layer 31 and the second wiring layer 32 in the light receiving portion 21 and the side surface of each of the first wiring layer 31 and the second wiring layer 32. That is, the resistance layer 33 is disposed in the gap G. The resistance layer 33 is formed on the surface opposite to the substrate 2 of the first wiring layer 31 and the second wiring layer 32 in the electrode portions 22 and 23 and the beam portions 24 and 25. The resistance layer 33 is electrically connected to each of the first wiring layer 31 and the second wiring layer 32. The thickness of the resistance layer 33 is, for example, about several tens to several hundreds of nm. The resistance layer 33 has an electric resistance depending on a temperature. The material of the resistance layer 33 is, for example, a material having a large change in electrical resistivity due to a temperature change such as amorphous silicon (a-Si).

The light absorption layer 34 is opposite to the surface 2a of the substrate 2 of the light receiving portion 21. The light absorption layer 34 is disposed at the side opposite to the substrate 2 with respect to the resistance layer 33. The light absorption layer 34 spreads in the substantially entire region of the light receiving portion 21 when viewed from the thickness direction of the substrate 2. The thickness of the light absorption layer 34 is, for example, about several tens of nm. The material of the light absorption layer 34 is, for example, $WSi_2$ or Ti.

The separation layer 35 is disposed between the first wiring layer 31 and the light absorption layer 34, and the second wiring layer 32 and the absorption layer 34. Specifically, the separation layer 35 is formed on the surface opposite to the substrate 2 of the resistance layer 33 in the light receiving portion 21, the beam portions 24 and 25, and the electrode portions 22 and 23. Then, the light absorption layer 34 is formed on the surface opposite to the substrate 2 of the separation layer 35 in the light receiving portion 21. The thickness of the separation layer 35 is, for example, about several hundreds of nm. The thickness of the separation layer 35 is larger than the thickness of each of the first wiring layer 31, the second wiring layer 32, the resistance layer 33, and the light absorption layer 34. The material of the separation layer 35 is, for example, a silicon nitride film (SiN) or the like.

When viewed from the thickness direction of the substrate 2, the light absorption layer 34 includes the first region 34a and the second region 34b. The first region 34a spreads to the side opposite to the second wiring layer 32 with respect to the first wiring layer 31 when viewed from the thickness direction of the substrate 2. The second region 34b spreads to the side opposite to the first wiring layer 31 with respect to the second wiring layer 32 when viewed from the thickness direction of the substrate 2. When viewed from the thickness direction of the substrate 2, the total area of the first wiring layer 31 and the second wiring layer 32 is smaller than each area of the first region 34a and the second region 34b.

Additionally, the first region 34a and the second region 34b of the light absorption layer 34 are formed on the resistance layer 33 with the separation layer 35 interposed therebetween. Further, the resistance layer 33 and the separation layer 35 are respectively formed continuously over the first region 34a and the second region 34b.

The membrane 20 is provided with through-holes 20c and 20d. The through-holes 20c and 20d are holes through which an etching gas for removing a sacrificial layer 6 to be described later passes. When viewed from the thickness direction of the substrate 2, the through-holes 20c and 20d are formed at one side of the second section L4. Specifically, the through-hole 20c is located between two first sections L3 in the first region 34a. The through-hole 20d is located between two third sections L5 in the second region 34b. When viewed from the thickness direction of the substrate 2, the through-holes 20c and 20d have a circular shape and the diameter is, for example, about several μm.

In the light detector 1 with the above-described configuration, light is detected as below. First, when incident light is incident to the light receiving portion 21, heat is generated in the light absorption layer 34 constituting an optical resonance structure to be described later. At this time, the light receiving portion 21 and the substrate 2 are thermally separated from each other by a space S. Further, the light receiving portion 21, the electrode portion 22, and the beam portion 24 are thermally separated from one another by the slit 20a. Further, the light receiving portion 21, the electrode portion 23, and the beam portion 25 are thermally separated from one another by the slit 20b. For this reason, heat generated in the light absorption layer 34 is suppressed from escaping to the substrate 2 through the beam portions 24 and 25 and the electrode portions 22 and 23.

The heat generated in the light absorption layer 34 is transmitted to the resistance layer 33 through the separation layer 35. Then, the resistance layer 33 increases in temperature and electric resistance due to the heat. Such a change in electric resistance is transmitted to the signal processing circuit unit 4 as a signal through the first and second wiring layers 31 and 32 and the electrode plugs 11 and 12 electrically connected to the resistance layer 33. Then, in the signal processing circuit unit 4, a change in electric resistance of the resistance layer 33 is converted into a change in voltage or current and light is detected on the basis of a change in voltage or current.

Figure 6:
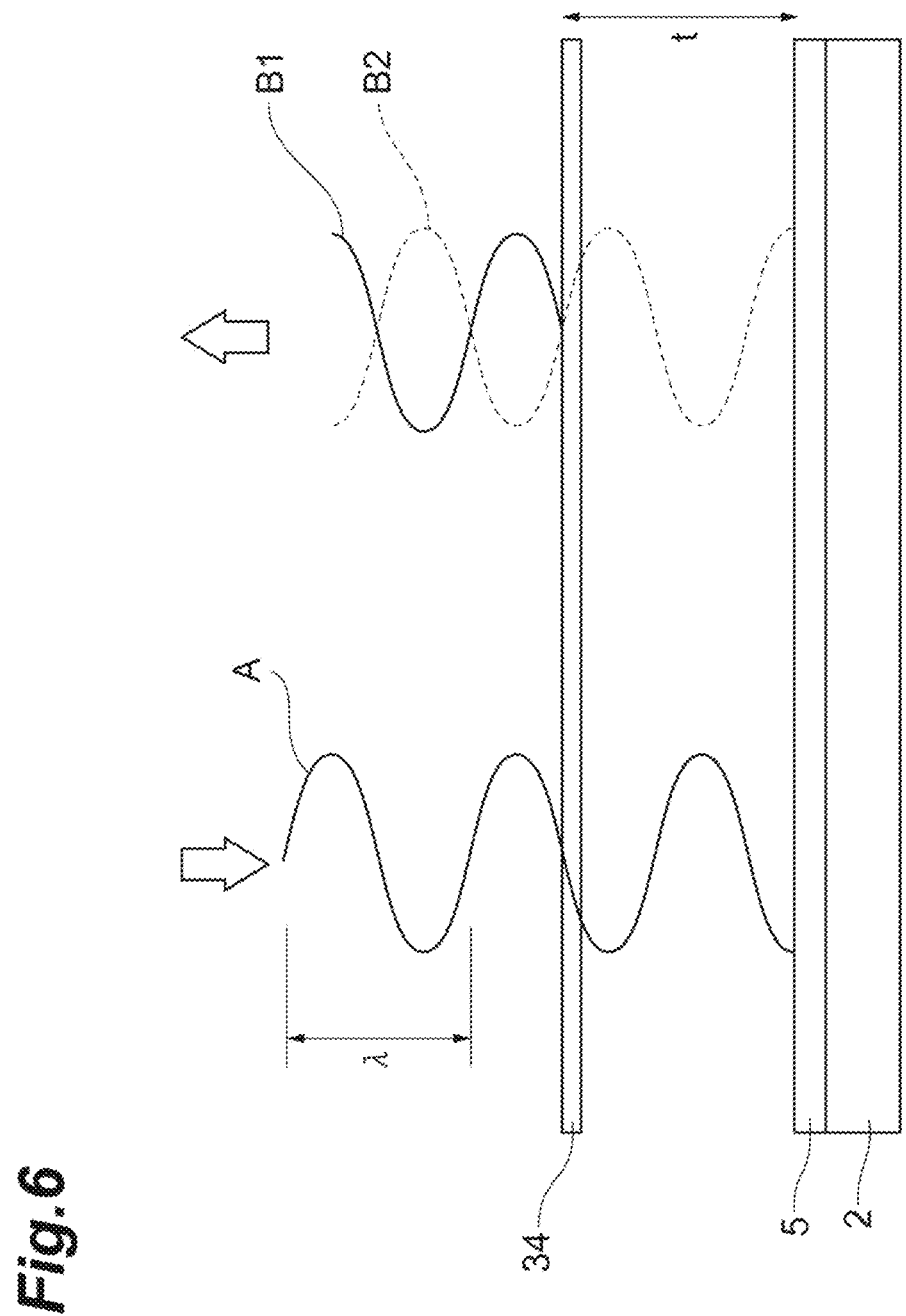
FIG. 6 is a diagram illustrating a principle of an optical resonance structure.

Next, the optical resonance structure will be described in detail. As illustrated in FIG. 6, a part of incident light A (having a wavelength λ) incident to the light absorption layer 34 is reflected as reflected light B1 by the light absorption layer 34 and the other part of the incident light A is transmitted through the light absorption layer 34. The other part of the incident light A transmitted through the light absorption layer 34 is reflected as reflected light B2 by the light reflection layer 5. Then, the reflected light B1 and the reflected light B2 interfere with each other to disappear on the reflection surface of the light absorption layer 34. Accordingly, the incident light A is absorbed on the reflection surface of the light absorption layer 34. Heat is generated in the light absorption layer 34 due to the energy of the absorbed incident light A.

The absorption rate of the incident light A can be determined by a sheet resistance of the light absorption layer 34 and an optical distance t between the light absorption layer 34 and the light reflection layer 5. The thickness of the light absorption layer 34 is set to about 16 nm (when the material of the light absorption layer 34 is $WSi_2$) so that the sheet resistance becomes a vacuum impedance (377 Ω/sq). Accordingly, the amplitude of the reflected light B1 reflected by the light absorption layer 34 matches the amplitude of the reflected light B2 reflected by the light reflection layer 5. For this reason, the reflected light B1 and the reflected light B2 efficiently interfere with each other to disappear on the reflection surface of the light absorption layer 34. Thus, the absorption rate of the incident light A is improved.

Further, the optical distance t is set so that t=(2 m−1)λ/4 (m=1, 2, 3, . . . ). Accordingly, the phases of the reflected light B1 and the reflected light B2 are shifted by 180°. For this reason, the reflected light B1 and the reflected light B2 efficiently interfere with each other to disappear on the reflection surface of the light absorption layer 34. Thus, the absorption rate of the incident light A is improved. In this way, the light reflection layer 5 constitutes an optical resonance structure along with the light absorption layer 34. When viewed from the thickness direction of the substrate 2, the incident light A is efficiently absorbed as the area of the overlapping portion between the light reflection layer 5 and the light absorption layer 34 becomes wider.

As described above, in the light detector 1 of the embodiment, the gap G between the first wiring layer 31 and the second wiring layer 32 extends along the line L including the curved portion L2. Accordingly, sensitivity is improved as compared with a case in which the gap G extends in a linear shape. Further, the first edge portion 31a at the side of the line L in the first wiring layer 31 and the second edge portion 32a at the side of the line L in the second wiring layer 32 respectively continuously extend. Accordingly, even when the membrane 20 is thinned in order to improve the response speed, the occurrence of stress concentration due to the deformation of the membrane 20 in the first edge portion 31a and the second edge portion 32a is suppressed. As described above, according to the light detector 1, sensitivity and response speed can be improved. The sensitivity means an ability of detecting light by the light detector 1. For example, it is understood that the sensitivity of the light detector 1 is high when the light detector 1 can detect weak light and the sensitivity of the light detector 1 is low when the light detector 1 cannot detect strong light. The response speed indicates a change rate of the temperature of the membrane 20 with respect to time when the light (for example, the amount of light) incident to the light receiving portion 21 changes. For example, it is understood that the response speed is fast when the time taken until the temperature of the membrane 20 rises to a predetermined stable temperature is short in a case in which the amount of light incident to the light receiving portion 21 increases and the response speed is slow when the time is long in that case.

Further, each of the first wiring layer 31 and the second wiring layer 32 is formed in the light receiving portion 21 to cross the light receiving portion 21. Accordingly, since the membrane 20 is reliably supported by the first wiring layer 31 and the second wiring layer 32, it is possible to suppress the distortion and deformation of the resistance layer 33 between the first wiring layer 31 and the second wiring layer 32.

Further, in the light detector 1, the line L includes a meandering portion L1 with a curved portion L2. According to this configuration, since the gap G is further lengthened, sensitivity can be further improved.

Further, in the light detector 1, the meandering portion L1 includes the first section L3 which swings to one side by a first swinging amount larger than a predetermined amount and the second section L4 which swings to one side by a second swinging amount smaller than a predetermined amount and the membrane 20 is provided with the through-holes 20c and 20d located at one side of the second section L4. According to this configuration, the positions of the through-holes 20c and 20d can be located near the center portion of the membrane 20 while preventing the through-holes 20c and 20d from penetrating the membrane 20 at the gap G. Thus, it is possible to highly efficiently form the membrane 20 by performing an etching through the through-holes 20c and 20d in the process of manufacturing the light detector 1.

Further, in the light detector 1, the second section L4 is sandwiched between two first sections L3 and the through-holes 20c and 20d are located between two first sections L3. According to this configuration, the positions of the through-holes 20c and 20d can be located near the center portion of the membrane 20 while preventing the through-holes 20c and 20d from penetrating the membrane 20 at the gap G. Thus, it is possible to highly efficiently form the membrane 20 by performing an etching through the through-holes 20c and 20d in the process of manufacturing the light detector 1.

Further, in the light detector 1, the light absorption layer 34 is opposite to the surface 2a of the substrate 2 and the separation layer 35 is disposed between the first wiring layer 31 and the light absorption layer 34, and the second wiring layer 32 and the absorption layer 34. The first region 34a of the light absorption layer 34 spreads to the side opposite to the second wiring layer 32 with respect to the first wiring layer 31 when viewed from the thickness direction of the substrate 2 and the second region 34b of the light absorption layer 34 spreads to the side opposite to the first wiring layer 31 with respect to the second wiring layer 32 when viewed from the thickness direction of the substrate 2. That is, the first region 34a of the light absorption layer 34 does not overlap the first wiring layer 31 and the second region 34b of the light absorption layer 34 does not overlap the second wiring layer 32 when viewed from the thickness direction of the substrate 2. Accordingly, sufficient light absorption in the first region 34a and the second region 34b of the light absorption layer 34 is realized. Further, the separation layer 35 is disposed between the first wiring layer 31 and the light absorption layer 34, and the second wiring layer 32 and the absorption layer 34. Accordingly, since the heat generated in the light absorption layer 34 is suppressed from escaping to the substrate 2 through the first wiring layer 31 and the second wiring layer 32, the heat is sufficiently transmitted to the resistance layer 33 through the separation layer 35. As described above, according to this configuration, sensitivity can be further improved. Further, since the separation layer 35 is disposed between each of the first wiring layer 31 and the second wiring layer 32 and the light absorption layer 34, the membrane 20 is difficult to warp.

Further, in the light detector 1, the third edge portion 31b at the side opposite to the line L in the first wiring layer 31 and the fourth edge portion 32b at the side opposite to the line L in the second wiring layer 32 continuously extend. According to this configuration, even when the membrane 20 is thinned in order to improve the response speed, it is possible to suppress the occurrence of stress concentration due to the deformation of the membrane 20 in the third edge portion 31b and the fourth edge portion 32b in addition to the first edge portion 31a and the second edge portion 32a.

Further, the light detector 1 further includes a light reflection layer 5 which is disposed on the surface 2a of the substrate 2 and constitutes an optical resonance structure along with the light absorption layer 34. According to this configuration, it is possible to realize light absorption in a wavelength region corresponding to a distance between the light absorption layer 34 and the light reflection layer 5.

Further, in the light detector 1, the total area of the first wiring layer 31 and the second wiring layer 32 is smaller than each area of the first region 34a and the second region 34b when viewed from the thickness direction of the substrate 2. According to this configuration, since more sufficient light absorption in the first region 34a and the second region 34b of the light absorption layer 34 is realized and the heat generated in the light absorption layer 34 is further suppressed from escaping to the substrate 2 through the first wiring layer 31 and the second wiring layer 32, sensitivity can be further improved.

Further, in the light detector 1, the length of each of the first wiring layer 31 and the second wiring layer 32 in a direction along the line L is larger than the width of each of the first wiring layer 31 and the second wiring layer 32 in a direction perpendicular to the line L when viewed from the thickness direction of the substrate 2. According to this configuration, since the gap G is further lengthened, sensitivity can be further improved.

Further, in the light detector 1, the first region 34a and the second region 34b of the light absorption layer 34 are formed on the resistance layer 33 with the separation layer 35 interposed therebetween. Further, the resistance layer 33 and the separation layer 35 are respectively formed continuously over the first region 34a and the second region 34b. According to this configuration, it is possible to suppress the deformation and warpage of the membrane 20 and to simplify the process of manufacturing the light detector 1.

Next, a method of manufacturing the light detector 1 will be described with reference to FIGS. 7 to 15. In FIGS. 7 to 15, I-I, II-II, III-III, IV-IV, and V-V of (b) are respectively cross-sectional views taken along the lines I-I, II-II, III-III, IV-IV, and V-V of (a).

First, as illustrated in FIG. 7, the substrate 2 is prepared and the light reflection layer 5 is formed on the surface 2a of the substrate 2. The light reflection layer 5 is formed in the above-described shape (for example, the same shape as that of the light absorption layer 34) by etching. Subsequently, as illustrated in FIG. 8, the sacrificial layer 6 is formed on the surface 2a of the substrate 2 to cover the light reflection layer 5. The material of the sacrificial layer 6 is, for example, polyimide or the like. Subsequently, as illustrated in FIG. 9, the through-holes 6a and 6b are formed in the sacrificial layer 6 by removing a part of the sacrificial layer 6 by etching. The surface 2a of the substrate 2 is exposed from each of the through-holes 6a and 6b.

Subsequently, as illustrated in FIG. 10, the electrode plug 11 is formed in the through-hole 6a and the electrode plug 12 is formed in the through-hole 6b. Subsequently, as illustrated in FIG. 11, the first wiring layer 31 and the second wiring layer 32 are formed on the sacrificial layer 6. The first wiring layer 31 and the second wiring layer 32 are formed in the above-described shape by etching. Subsequently, as illustrated in FIG. 12, the resistance layer 33 is formed on the sacrificial layer 6 to cover the first wiring layer 31 and the second wiring layer 32 and the separation layer 35 is formed on the resistance layer 33.

Figure 13:
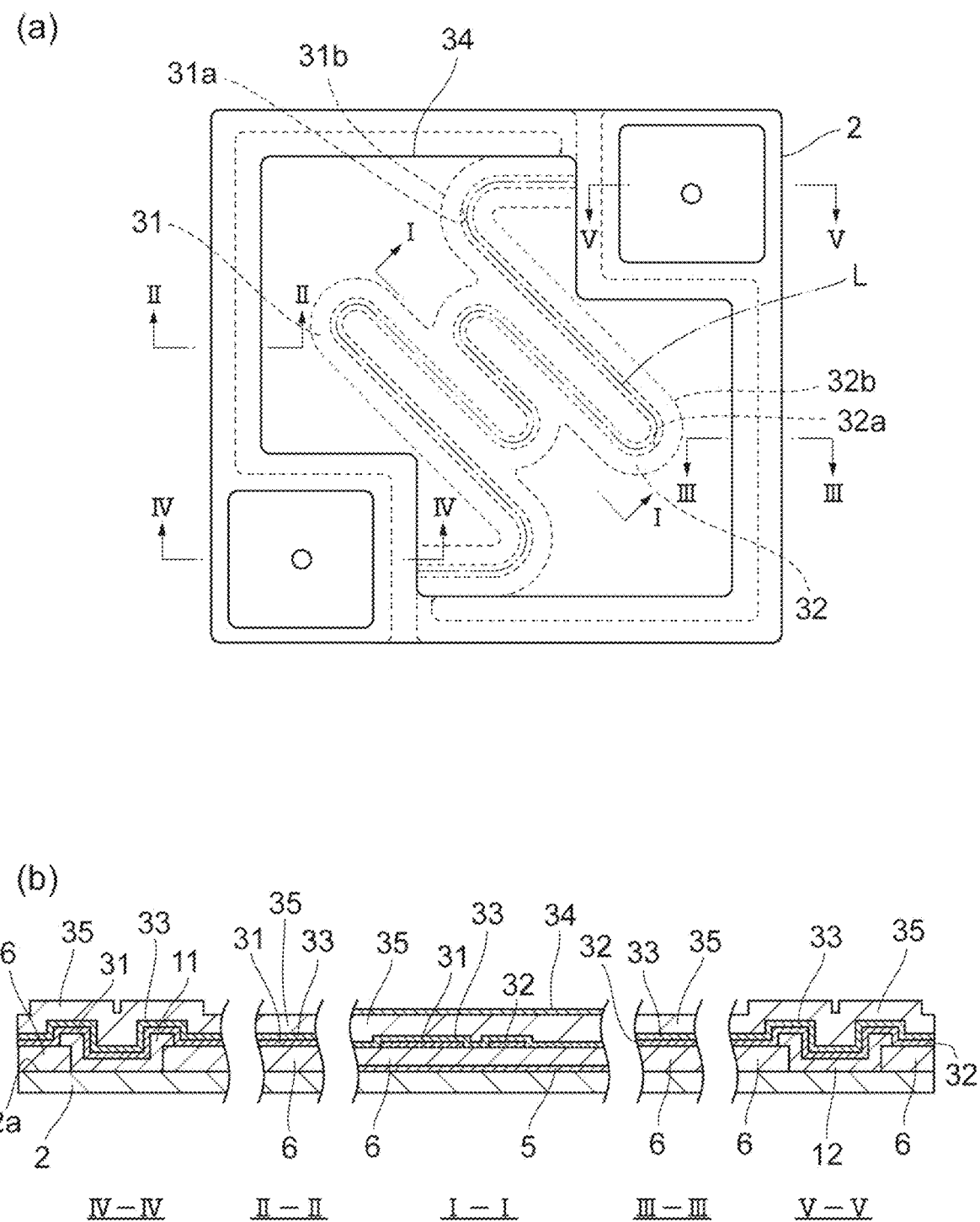
FIG. 13 is a diagram illustrating the light detector manufacturing method of FIG. 5.

Subsequently, as illustrated in FIG. 13, the light absorption layer 34 is formed on the separation layer 35. The light absorption layer 34 is formed in the above-described shape by etching. Subsequently, as illustrated in FIG. 14, the slits 20a and 20b and the through-holes 20c and 20d are formed. The slits 20a and 20b and the through-holes 20c and 20d are formed at the above-described positions by etching. Subsequently, as illustrated in FIG. 15, the space S is formed by removing the sacrificial layer 6 while the etching is performed from the slits 20a and 20b and the through-holes 20c and 20d.

In the light detector 1, the meandering portion L1 includes the first section L3 which swings to one side by a first swinging amount larger than a predetermined amount and the second section L4 which swings to one side by a second swinging amount smaller than a predetermined amount and the membrane 20 is provided with the through-holes 20c and 20d located at one side of the second section L4. According to this configuration, the positions of the through-holes 20c and 20d can be located near the center portion of the membrane 20 while preventing the through-holes 20c and 20d from penetrating the membrane 20 at the gap G. Thus, it is possible to highly efficiently form the membrane 20 by performing an etching through the through-holes 20c and 20d in the process of manufacturing the light detector 1.

Although the embodiment of the invention has been described above, an aspect of the invention is not limited to the above-described embodiment.

In the above-described embodiment, an example in which the membrane 20 has, for example, a rectangular shape when viewed from the thickness direction of the substrate 2 has been described, but the invention is not limited thereto. The membrane 20 may have, for example, various shapes such as a circular shape when viewed from the thickness direction of the substrate 2.

Further, the first wiring layer 31 may spread in the substantially entire region of the first region 34a and the second wiring layer 32 may spread in the substantially entire region of the second region 34b when viewed from the thickness direction of the substrate 2. That is, each of the third edge portion 31b of the first wiring layer 31 and the fourth edge portion 32b of the second wiring layer 32 may overlap the outer edge of the light receiving portion 21. Further, an example is illustrated in which the positions of the first wiring layer 31 and the second wiring layer 32 in the thickness direction of the substrate 2 match each other, but the positions of the first wiring layer 31 and the second wiring layer 32 in the thickness direction of the substrate 2 may not match each other.

Further, the resistance layer 33 may not be formed in, for example, a region corresponding to the electrode portions 22 and 23, the beam portions 24 and 25, and the first region 34a and a region corresponding to the second region 34b.

Further, the separation layer 35 may not be disposed in, for example, a region corresponding to the electrode portions 22 and 23, the beam portions 24 and 25, and the first region 34a and a region corresponding to the second region 34b. Further, the thickness of the separation layer 35 may be equal to or smaller than the thickness of each of the first wiring layer 31, the second wiring layer 32, the resistance layer 33, and the light absorption layer 34. Further, the material of the separation layer 35 may be the same as that of the resistance layer 33.

Further, the total area of the first wiring layer 31 and the second wiring layer 32 may be smaller than the total area of the first region 34a and the second region 34b when viewed from the thickness direction of the substrate 2. According to this configuration, as described above, since more sufficient light absorption in the first region 34a and the second region 34b of the light absorption layer 34 is realized and the heat generated in the light absorption layer 34 is further suppressed from escaping to the substrate 2 through the first wiring layer 31 and the second wiring layer 32, sensitivity can be further improved.

Further, the separation layer 35 and the light absorption layer 34 may be formed at the side of the substrate 2 in the first wiring layer 31 and the second wiring layer 32. Specifically, the separation layer 35 is formed on the electrode plugs 11 and 12. The first wiring layer 31, the second wiring layer 32, and the resistance layer 33 are formed on the surface opposite to the substrate 2 in the separation layer 35. The light absorption layer 34 is formed on the surface at the side of the substrate 2 in the separation layer 35. Accordingly, the light absorption layer 34 and the light reflection layer 5 directly face each other with the space S interposed therebetween. For this reason, since it is easy to adjust the optical distance t, it is possible to more reliably absorb light by the optical resonance structure. Additionally, also in this case, the first wiring layer 31 is electrically connected to the electrode plug 11. The second wiring layer 32 is electrically connected to the electrode plug 12.

Further, when the resistance layer 33 is formed between the first wiring layer 31 and the light absorption layer 34, and the second wiring layer 32 and the absorption layer 34, the membrane 20 may not include the separation layer 35. In this case, the resistance layer 33 serves as both the resistance layer 33 and the separation layer 35. Accordingly, since the thermal conductance of the membrane 20 is low, the response speed can be improved. Further, accordingly, since the element resistance of the membrane 20 is low, noise can be reduced.

Further, the resistance layer 33 may be formed on the side of the substrate 2 in the first wiring layer 31 and the second wiring layer 32. In this case, the resistance layer 33 is not disposed in the gap G. Additionally, also in this case, the first wiring layer 31 is electrically connected to the electrode plug 11. The second wiring layer 32 is electrically connected to the electrode plug 12.

Further, the resistance layer 33, the separation layer 35, and the light absorption layer 34 may be formed on the side of the substrate 2 in the first wiring layer 31 and the second wiring layer 32. Specifically, the separation layer 35 is framed on the electrode plugs 11 and 12. The resistance layer 33 is formed on the surface opposite to the substrate 2 in the separation layer 35. The first wiring layer 31 and the second wiring layer 32 are formed on the surface opposite to the substrate 2 in the resistance layer 33. The light absorption layer 34 is formed on the surface at the side of the substrate 2 in the separation layer 35. Additionally, also in this case, the first wiring layer 31 is electrically connected to the electrode plug 11. The second wiring layer 32 is electrically connected to the electrode plug 12.

Further, even when the resistance layer 33 and the light absorption layer 34 are formed on the side of the substrate 2 in the first wiring layer 31 and the second wiring layer 32, the membrane 20 may not include the separation layer 35 as long as the resistance layer 33 is formed between the first wiring layer 31 and the light absorption layer 34, and the second wiring layer 32 and the absorption layer 34. That is, also in this case, the resistance layer 33 serves as both of the resistance layer 33 and the separation layer 35. Additionally, also in this case, the first wiring layer 31 is electrically connected to the electrode plug 11. The second wiring layer 32 is electrically connected to the electrode plug 12.

Further, in the above-described configurations, the material of the light absorption layer 34 may be, for example, a material having a large absorption rate with respect to light such as black resin. Additionally, in this case, the optical resonance structure is not provided and light is directly absorbed by the light absorption layer 34. Accordingly, as described above, the optical distance t may not be accurately adjusted. Additionally, it is desirable that the light detecting element 10 include the light reflection layer 5 even when the optical resonance structure is not provided. The reason is as below. When a part of the incident light A incident to the light absorption layer 34 is not absorbed by the light absorption layer 34 and is transmitted through the membrane 20, the incident light A transmitted through the membrane 20 is reflected by the light reflection layer 5 and is again incident to the light absorption layer 34. The incident light A which is incident to the light absorption layer 34 again is absorbed by the light absorption layer 34 to become heat. Accordingly, the absorption rate of the light is improved. Further, when the separation layer 35 is disposed between the light absorption layer 34 and the resistance layer 33 in a case in which the material of the light absorption layer 34 is black resin, the light absorption layer 34 contacts the resistance layer 33 so that an influence on the characteristic of the resistance layer 33 is suppressed.

Further, in the above-described configurations, the separation layer 35 may be further formed on the surface at the side of the substrate 2 in the membrane 20. Accordingly, it is possible to stabilize the resistance layer 33 and to make the membrane 20 harder to warp.

Further, each of the first wiring layer 31, the second wiring layer 32, the resistance layer 33, the light absorption layer 34, and the separation layer 35 can be formed with various materials and thicknesses. When each of the first wiring layer 31, the second wiring layer 32, the resistance layer 33, and the separation layer 35 is formed with optimal materials and thicknesses, the sensitivity can be easily improved and the strength of the membrane 20 can be improved. Further, it is possible to improve both sensitivity and response speed by selecting an optimal material for each of the first wiring layer 31, the second wiring layer 32, and the light absorption layer 34 as compared with a conventional structure (for example, see Patent Literature U.S. Pat. No. 6,426,539 B1) using the wiring layer as the light absorption layer.

Further, the through-holes 20c and 20d may have various shapes such as an oval shape or a square shape when viewed from the thickness direction of the substrate 2.

Further, the pixel unit 3 may constituted by one light detecting element 10.

REFERENCE SIGNS LIST

1: light detector, 2: substrate, 2a: surface, 20: membrane, 20c, 20d: through-hole, 31: first wiring layer, 31a: first edge portion, 31b: third edge portion, 32: second wiring layer, 32a: second edge portion, 32b: fourth edge portion, 33: resistance layer, 34: light absorption layer, 34a: first region, 34b: second region, 35: separation layer, 5: light reflection layer, L: line, L1: meandering portion, L2: curved portion, L3: first section, L4: second section, S: space, G: gap.

The invention claimed is:

1. A light detector comprising:
a substrate;
a membrane including a light receiving portion, a pair of electrodes, and a pair of beams connected to the pair of electrodes and the light receiving portion; and
a pair of electrode plugs disposed on a surface of the substrate to support the membrane above the surface to form a space between the surface and the membrane,
wherein the light receiving portion spreads to avoid the pair of electrode plugs when viewed from a thickness direction of the substrate,
the pair of electrodes are disposed on the pair of electrode plugs to form a pair of slits between the pair of electrodes and the light receiving portion;
wherein the membrane includes, in the light receiving portion:
a first wiring layer and a second wiring layer which are opposite each other with a gap extending along a line having a curved portion interposed therebetween and a resistance layer which is electrically connected to each of the first wiring layer and the second wiring layer and has an electric resistance depending on a temperature,
wherein a first edge portion at the side of the line in the first wiring layer and a second edge portion at the side of the line in the second wiring layer respectively continuously extend, and
when viewed from a thickness direction of the substrate, the line meanders to swing orthogonally to a straight line connecting a pair of corner portions of the membrane, the corner portions opposing each other.

2. The light detector according to claim 1, wherein the line includes a meandering portion having the curved portion.

3. The light detector according to claim 2, wherein the meandering portion includes a first section which swings to one side by a first swinging amount larger than a predetermined amount and a second section which swings to one side by a second swinging amount smaller than the predetermined amount, and
wherein the membrane is provided with a through-hole which is located at one side of the second section.

4. The light detector according to claim 3, wherein the second section is sandwiched between the two first sections, and
wherein the through-hole is located between the two first sections.

5. A light detector comprising:
a substrate; and
a membrane which is supported on a surface of the substrate so that a space is formed between the surface of the substrate and the membrane,
wherein the membrane includes a first wiring layer and a second wiring layer which are opposite each other with a gap extending along a line having a curved portion interposed therebetween and a resistance layer which is electrically connected to each of the first wiring layer and the second wiring layer and has an electric resistance depending on a temperature,
wherein a first edge portion at the side of the line in the first wiring layer and a second edge portion at the side of the line in the second wiring layer respectively continuously extend,
wherein the membrane further includes a light absorption layer which is opposite to the surface of the substrate and a separation layer which is disposed between the first wiring layer and the light absorption layer, and the second wiring layer and the absorption layer, and
wherein the light absorption layer includes a first region which spreads to the side opposite to the second wiring layer with respect to the first wiring layer when viewed from the thickness direction of the substrate and a second region which spreads to the side opposite to the first wiring layer with respect to the second wiring layer when viewed from the thickness direction of the substrate.

6. The light detector according to claim 5, wherein a third edge portion at the side opposite to the line in the first wiring layer and a fourth edge portion at the side opposite to the line in the second wiring layer continuously extend.

7. The light detector according to claim 5, further comprising:
a light reflection layer which is disposed on the surface of the substrate and constitutes an optical resonance structure along with the light absorption layer.

8. The light detector according to claim 5,
wherein a total area of the first wiring layer and the second wiring layer is smaller than a total area of the first region and the second region when viewed from the thickness direction of the substrate.

9. The light detector according to claim 5,
wherein a total area of the first wiring layer and the second wiring layer is smaller than a area of each of the first region and the second region when viewed from the thickness direction of the substrate.

10. The light detector according to claim 5,
wherein a length of each of the first wiring layer and the second wiring layer in a direction along the line is larger than a width of each of the first wiring layer and the second wiring layer in a direction perpendicular to the line when viewed from the thickness direction of the substrate.

11. A light detector comprising:
a substrate; and
a membrane which is supported on a surface of the substrate so that a space is formed between the surface of the substrate and the membrane,
wherein the membrane includes a first wiring layer and a second wiring layer which are opposite each other with a gap extending along a line having a curved portion interposed therebetween and a resistance layer which is electrically connected to each of the first wiring layer and the second wiring layer and has an electric resistance depending on a temperature,
wherein a first edge portion at the side of the line in the first wiring layer and a second edge portion at the side of the line in the second wiring layer respectively continuously extend,
wherein the line includes a meandering portion having the curved portion,
wherein the meandering portion includes a first section which swings to one side by a first swinging amount larger than a predetermined amount and a second section which swings to one side by a second swinging amount smaller than the predetermined amount, and
wherein the membrane is provided with a through-hole which is located at one side of the second section.

12. The light detector according to claim 11,
wherein the second section is sandwiched between the two first sections, and
wherein the through-hole is located between the two first sections.

* * * * *